(12) United States Patent
Yoshioka

(10) Patent No.: US 7,106,082 B2
(45) Date of Patent: Sep. 12, 2006

(54) STAGE DRIVING APPARATUS AND PROBE METHOD

(75) Inventor: Haruhiko Yoshioka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/041,284

(22) Filed: Jan. 25, 2005

(65) Prior Publication Data

US 2005/0127898 A1 Jun. 16, 2005

Related U.S. Application Data

(63) Continuation of application No. PCT/JP03/09879, filed on Aug. 4, 2003.

(30) Foreign Application Priority Data

Aug. 7, 2002 (JP) .............................. 2002-230563

(51) Int. Cl.
*G01R 31/26* (2006.01)

(52) U.S. Cl. .................... 324/760; 324/765; 324/158.1

(58) Field of Classification Search ................ 324/760, 324/758, 754, 765, 158.1; 250/442.11
See application file for complete search history.

(56) References Cited

U.S. PATENT DOCUMENTS 5,642,056 A * 6/1997 Nakajima et al. ........... 324/758

6,501,289 B1 * 12/2002 Takekoshi .................... 324/758
2001/0054892 A1    12/2001 Takekoshi
2004/0227536 A1 * 11/2004 Sugiyama et al. .......... 324/760

FOREIGN PATENT DOCUMENTS

| JP | 7-321165 | 12/1995 |
|---|---|---|
| JP | 9-330960 | 12/1997 |
| JP | 11-251379 | 9/1999 |

* cited by examiner

*Primary Examiner*—Kiet T. Nguyen
(74) *Attorney, Agent, or Firm*—Oblon, Spivak, McClelland, Maier & Neustadt, P.C.

(57) ABSTRACT

A stage driving apparatus for a stage of this invention includes a horizontal driving mechanism which moves in a horizontal direction a stage to place a wafer thereon, and an elevating mechanism which moves the stage in a vertical direction. The elevating mechanism has a first elevating mechanism which supports the horizontal driving mechanism and vertically moves the horizontal driving mechanism, and a second elevating mechanism which supports the stage on the horizontal driving mechanism and vertically moves the stage over a short distance with a piezoelectric element.

13 Claims, 7 Drawing Sheets

STAGE DRIVING APPARATUS AND PROBE METHOD

CROSS-REFERENCE TO RELATED APPLICATIONS

This is a Continuation Application of PCT Application No. PCT/JP03/09879, filed Aug. 4, 2003, which was not published under PCT Article 21(2) in English.

This application is based upon and claims the benefit of priority from prior Japanese Patent Application No. 2002-230563, filed Aug. 7, 2002, the entire contents of which are incorporated herein by reference.

BACKGROUND OF THE INVENTION

1. Field of the Invention

The present invention relates to a stage driving apparatus for a stage and a probe method and, more particularly, to a stage driving apparatus for a stage and a probe method which can test an object to be tested at high speed.

2. Description of the Related Art

In a semiconductor device manufacturing process, the electrical characteristics of a device formed on a wafer are tested. For example, a prober having a stage driving apparatus for a stage as shown in FIG. 7 is used for this testing. A stage 1 whereon a wafer W is placed and which incorporates an elevating mechanism, an X stage 2 which supports the stage 1 and can move in an X direction, and a Y stage 3 which supports the X stage 2 and can move in a Y direction are arranged in the prober chamber of the prober. When the electrical characteristics of the wafer W are to be tested, the X stage 2 and Y stage 3 are moved in the X and Y directions, respectively. Thus, the stage 1 is moved in the X and Y directions, and the stage is rotated in a θ direction by a rotary mechanism 1a, to align the wafer and a probe card with each other. After that, the stage 1 is vertically moved in a Z direction by the elevating mechanism, to test the electrical characteristics of the wafer W with the probes of a probing card (not shown) in contact with the wafer W.

When a ball screw 2a rotates clockwise and counterclockwise, the X stage 2 reciprocates in the X direction along a pair of guide rails 2b arranged on the Y stage 3. When a ball screw 3a rotates clockwise and counterclockwise, the Y stage 3 reciprocates in the Y direction along a pair of guide rails 3b arranged on a base 4. Reference numeral 3c denotes a motor; 3d, a rotation amount detector. The elevating mechanism of the stage 1 can include, e.g., a ball screw, motor, and elevation guide. When the ball screw is rotated clockwise and counterclockwise by the motor, the stage 1 vertically moves along the elevation guide.

The prober has an alignment mechanism 5 to align the probes of the probing card and the electrode pads of the wafer W with each other. The alignment mechanism 5 includes an upper camera 5b (to imaged sense the wafer W) attached to an alignment moving mechanism 5c, and a lower camera 5a (to imaged sense the probes) provided to the stage 1. The alignment moving mechanism 5c moves from the deepest portion in the prober chamber to the center (in the direction of an arrow Y) along a pair of guide rails (not shown).

The degree of integration of devices is increasing year by year. The number of devices to be tested at once (simultaneous measurement number) increases. The contact load applied by the probes to the wafer W increases greatly. Accordingly, the rigidity of the stage 1 must be increased, so that the weight of the stage 1 increases. In order to improve the throughput of testing, the X and Y stages 2 and 3 and the elevating mechanism must operate at higher speeds. As the diameter or the like of the wafer W increases, the apparatus increases in size and weight.

In the conventional prober, the stage 1 is arranged on the X and Y stages 2 and 3. Thus, the contact load increases, and the rigidity and weight of the stage 1 increase. It has become difficult to operate at higher speeds the elevating mechanism of the stage 1 and the X and Y stages 2 and 3 on which the heavy stage 1 is placed. Accordingly, to increase the speed of testing has become difficult. Due to the rigidity of the ball screws of the elevating mechanism of the stage 1, the limit of the motor torque, and the like, to increase the speed for vertically moving the stage 1 is also limited.

BRIEF SUMMARY OF THE INVENTION

According to a first aspect of the present invention, there is provided a stage driving apparatus formed to move a stage for placing a substrate to be tested on a stage surface thereof in horizontal and vertical directions. The stage driving apparatus comprises: a second elevating mechanism configured to support the stage and move the stage in the vertical direction; a first horizontal driving mechanism configured to support the second elevating mechanism and move the second elevating mechanism on a horizontal plane; and a first elevating mechanism configured to support the first horizontal driving mechanism and move the first horizontal driving mechanism in the vertical direction.

The stage driving apparatus preferably comprises any one of the following (a) to (i) and, furthermore, some of the following (a) to (i) in combination.

(a) The second elevating mechanism has a plurality of linear-direction driving members 19, the plurality of linear-direction driving members being configured to support the stage at a plurality of portions and move the stage in the vertical direction.

(b) The linear-direction driving members include one of a piezoelectric-effect member and a ball screw.

(c) The second elevating mechanism has at least one second horizontal driving mechanism which generates a driving force in the horizontal direction, and at least one direction switching unit which converts the horizontal-direction driving force of the second horizontal driving mechanism into a driving force in the vertical direction.

(d) The direction switching unit includes:

a first wedge member arranged on the first horizontal driving member to be movable (the first wedge member is moved forward/backward in the horizontal direction by the horizontal-direction driving force of the second horizontal driving mechanism); and a second wedge member fixed to a lower portion of the stage, wherein the first wedge member is arranged to oppose the second wedge member, and moved forward/backward in the horizontal direction by the horizontal-direction driving force of the second horizontal driving mechanism, to move the second wedge member, thus moving the stage in the vertical direction.

(e) The direction switching unit includes:

a turning member (the turning member is turned by the horizontal-direction driving force of the second horizontal driving mechanism, a distal end of the turning member comes into contact with a lower portion of the stage, and the turning member turns to move the stage in the vertical direction); and a support member which supports the turning member to be turnable.

(f) The first elevating mechanism includes at least one first elevating member having a support which supports the first horizontal driving mechanism and can move in the vertical direction, a guide member which guides movement in the vertical direction of the support, and a ball screw and motor configured to vertically move the support along the guide member.

(g) The first elevating mechanism serves, in addition to moving the first horizontal driving mechanism in the vertical direction, to adjust an angle of inclination of the stage such that the stage surface of the stage becomes parallel to a position of a distal end of a predetermined probe among probes of a probing card arranged above the stage.

(h) The first elevating mechanism includes a plurality of first elevating members, each of the first elevating members being configured to support the first horizontal driving mechanism through a rotary support mechanism and move the first horizontal driving mechanism in the vertical direction.

(i) The second elevating mechanism can also adjust the angle of inclination of the stage such that the stage surface of the stage becomes parallel to the distal ends of the probes of the probing card that is arranged above the stage.

According to a second aspect of the present invention, there is provided, in a prober comprising a tester and stage, a probe method of testing electrical characteristics of an object to be tested on a substrate to be tested. The probe method comprises:

(a1) placing the substrate to be tested on a stage surface of the stage;

(a2) detecting a position of the object to be tested formed on the substrate to be tested and a position of a predetermined probe among a plurality of probes of a probing card arranged above the stage;

(a3) moving the stage in X, Y, Z, and θ directions to align the object to be tested on the substrate to be tested on the stage and the probes of the probing card arranged on the stage;

(a4) moving the stage upward by the first elevating mechanism toward the probing card (the upward movement not bringing the object to be tested on the stage into contact with the plurality of probes of the probing card);

(a5) over-driving the stage toward the probes by the second elevating mechanism after the object to be tested, which is mounted on the stage, is set into contact with the probe;

(a6) testing the electrical characteristics of the object to be tested with a tester;

(a7) after testing, moving the stage downward by the second elevating mechanism to separate the object to be tested from the probes;

(a8) indexing the stage by the horizontal driving mechanism, such indexing serving to move the next object to be tested to a position immediately below the probes of the probing card; and (a9) repeating (a5) to (a8) to test the electrical characteristics of a predetermined object to be tested on the substrate to be tested.

The probe method preferably comprises, after position detection of (a2), performing the following (a2') and/or (a2"):

(a2') adjusting an angle of inclination of the stage by the first elevating mechanism such that the stage surface of the stage becomes parallel to a position of a distal end of a predetermined probe among the probes of the probing card arranged above the stage.

(a2") adjusting the angle of inclination of the stage by the second elevating mechanism such that the stage surface of the stage becomes parallel to the distal end of a prescribed one of the probes of the probing card that is arranged above the stage.

DETAILED DESCRIPTION OF THE INVENTION

It is an object of the present invention to solve at least one of the above problems.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

EMBODIMENT OF THE INVENTION

The present invention can be suitably applied to a prober which tests the electrical characteristics of an object to be tested (integrated circuit) formed on a wafer-like substrate to be tested. The present invention is not limited to a stage in this prober, but can be a stage driving apparatus to move a stage whereon a general object is placed, particularly an object to be tested, in the horizontal and vertical directions.

In the following description, for descriptive convenience, the present invention will be exemplified by a stage driving apparatus applied to move in the horizontal and vertical directions a stage for a prober that tests the electrical characteristics of the object to be tested (integrated circuit) formed on the substrate to be tested (wafer).

The present invention will be described based on an embodiment shown in FIGS. 1 to 6, and FIGS. 8 to 9. A prober 10 according to this embodiment can be formed in the same manner as the conventional prober except for the points to be described below.

Figure 1:
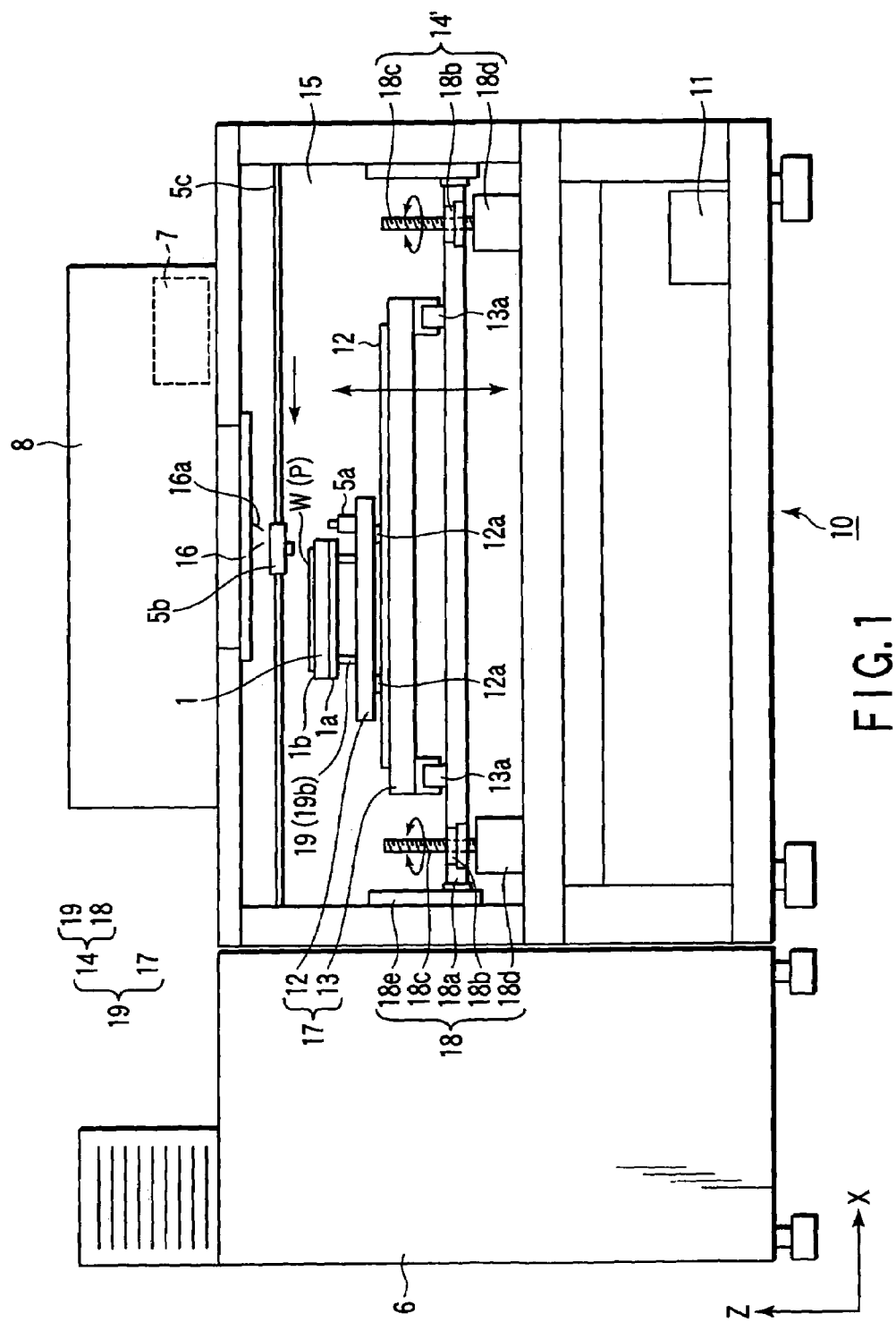
FIG. 1 is a sectional view schematically showing the prober chamber side of a prober according to one embodiment of the present invention.

As shown in FIG. 1, the prober 10 according to this embodiment can have a stage 1 whereon a wafer W is placed, a first horizontal driving mechanism 17 which supports the stage 1 and moves the stage 1 in the horizontal direction, an elevating mechanism 14 to move the stage 1 in the vertical direction, and alignment mechanisms 5a and 5b.

The prober 10 can also have a rotary mechanism 1a to rotate the stage 1 in the θ direction. The elevating mechanism 14 can include a first elevating mechanism 18 and second elevating mechanism 19.

The first horizontal driving mechanism 17 can have a Y table 13 which moves in the Y direction, and an X table 12 which is arranged on the Y table and moves in the X direction.

Under the control of a controller 11, the first horizontal driving mechanism 17 can move the stage 1 in the X and Y directions in a prober chamber 15.

The elevating mechanism 14 moves the stage 1 upward in the Z direction, to bring the wafer W on the stage 1 into electrical contact with probes 16a of a probing card 16 arranged above the wafer W. In this state, a tester 7 tests the electrical characteristics of the integrated circuits on the wafer W.

Figure 7:
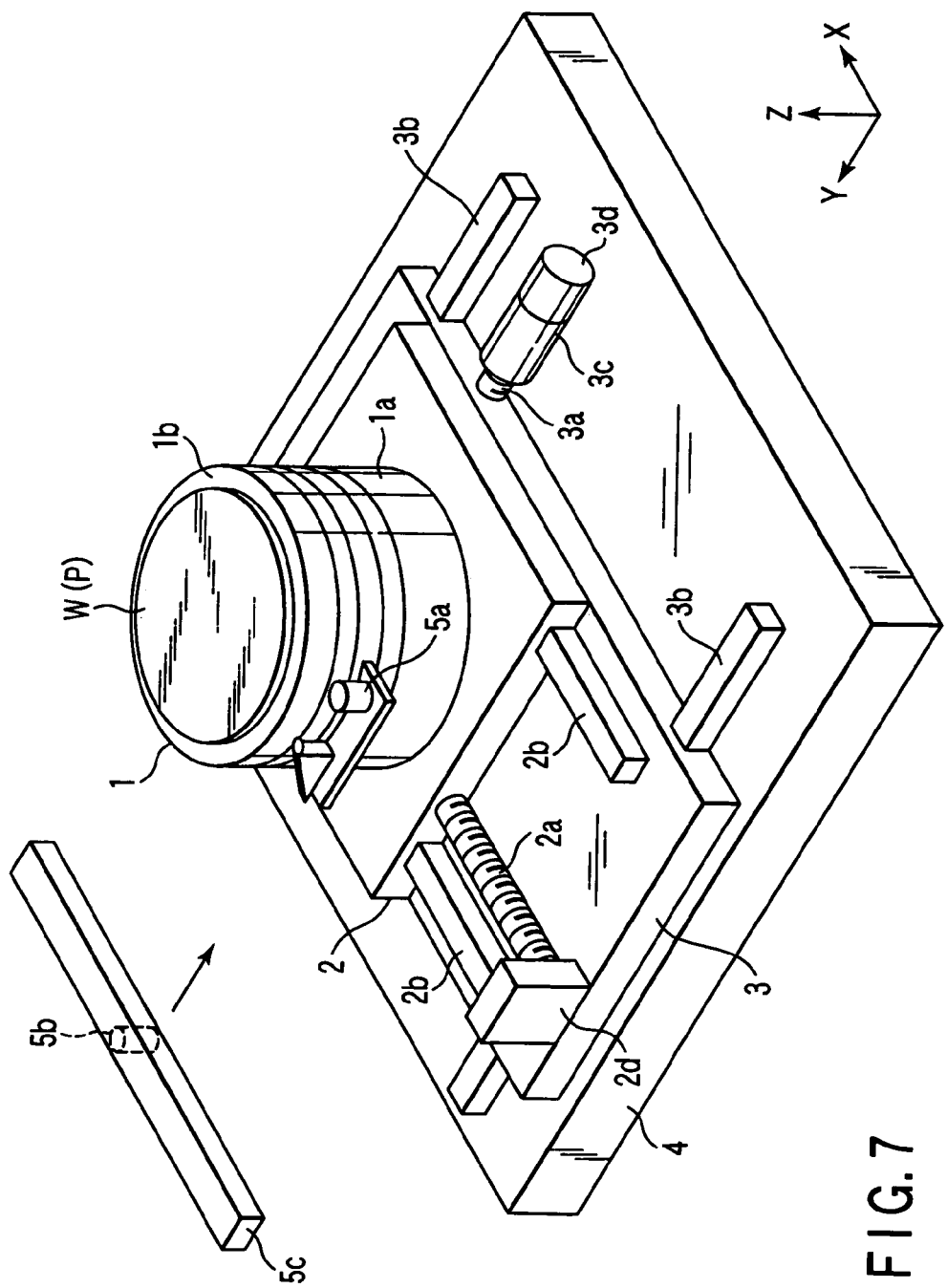
FIG. 7 is a perspective view showing an example of a stage driving apparatus for a stage applied to a conventional prober.

As shown in FIG. 1, the X table 12 can reciprocate along a pair of X-direction guide rails 12a arranged on the Y table 13. The Y table 13 can reciprocate along a pair of Y-direction guide rails 13a arranged on a support plate 18a. The X and Y tables 12 and 13 are connected to motors (AC servo motors or the like) 2d and 3d (see FIG. 7) through ball screws 2a and 3a (see FIG. 7) in the same manner as in the prior art. When the motors rotate the ball screws, the X and Y tables move in the X and Y directions. Accordingly, the X and Y tables 12 and 13 move the stage 1 in the X and Y directions within a horizontal plane. In the following description, the two tables 12 and 13 as a whole will be referred to as the first horizontal driving mechanism 17 when necessary.

The first horizontal driving mechanism 17 can be any mechanism as far as it is a mechanism that moves the stage 1 in the horizontal direction. For example, the first horizontal driving mechanism 17 can be a mechanism based on a linear driving principle.

In this embodiment, the elevating mechanism 14 is divided into the first elevating mechanism 18 and second elevating mechanism 19, as shown in FIG. 1. As a result, the second elevating mechanism 19 is made lightweight. The speed of the first horizontal driving mechanism 17 can be increased. The first elevating mechanism 18 supports the first horizontal driving mechanism 17 and stage 1 by its support plate 18a, and vertically moves them integrally. The second elevating mechanism 19 can be arranged on the first horizontal driving mechanism 17. The second elevating mechanism 19 vertically moves the stage 1.

The first elevating mechanism 18 can vertically move the stage 1 over a long distance (e.g., 20 to 50 mm) when performing alignment or moving the stage 1 close to the probing card 16. The second elevating mechanism 19 can vertically move the stage 1 over a short distance (e.g., several hundred μm) when, e.g., bringing the probes 16a of the probing card 16 into contact with, or separating them from, the electrode pads of an object P to be tested after alignment.

Furthermore, the first elevating mechanism 18 can also control the inclination of the stage 1 such that a stage surface 1b of the stage 1 becomes parallel to the probing card 16.

Furthermore, the first elevating mechanism 18 can adjust the inclination of the stage 1 such that the stage surface 1b of the stage 1 becomes parallel to the distal ends of a prescribed one of the probes 16a of the probing card 16 that is arranged above the stage. The second elevating mechanism 19 may be configured to adjust the inclination of the stage 1, too. Then, the inclination of the stage 1 can be controlled by the first elevating mechanism 18 or the second elevating mechanism 19, or by both.

As shown in FIG. 1, the stage 1 is supported by the first horizontal driving mechanism 17, and the first horizontal driving mechanism 17 is arranged on the support plate 18a of the first elevating mechanism 18. The support plate 18a can have nut members 18b attached to its four corners, ball screws 18c which threadably engage with the corresponding nut members 18b, motors (e.g., AC servo motors) 18d connected to the corresponding ball screws 18c, and guide rails 18e which guide the support plate 18a in the Z direction.

The ball screws 18c can support the support plate 18a at four points and vertically move the support plate 18a. Even when a large contact load is applied to the stage 1 from the probes 16a, the support plate 18a is not likely to be inclined. The stage 1 is also not likely to be inclined.

Figure 8:
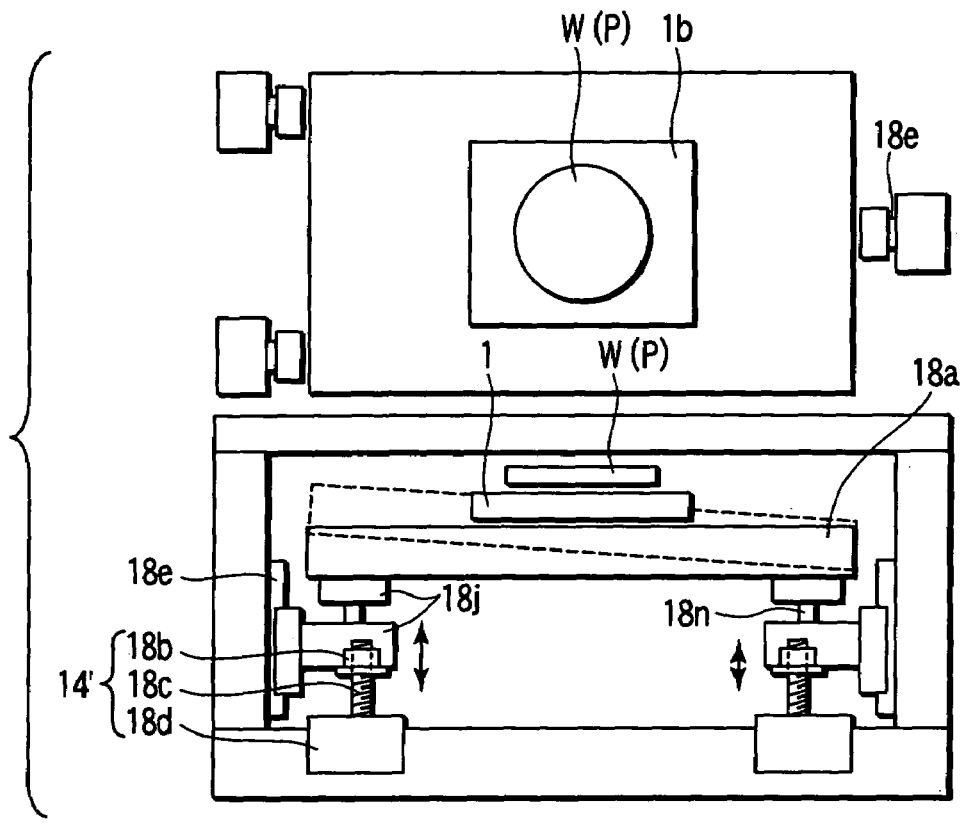
FIG. 8 is a sectional view of a first elevating mechanism configured such that a first elevating member supports a first horizontal driving mechanism through a rotary support mechanism.

A rotatary support mechanism suitable when the first elevating mechanism 18 controls the inclination of the stage 1 such that the stage surface 1b of the stage 1 becomes parallel to a position of a distal end of a predetermined probe among the probes 16a of the probing card 16 will be described with reference to FIGS. 8 and 9. Referring to FIG. 8, the first elevating means 14 can support the support plate 18a through a rotary support mechanism (e.g., ball joint) 18j. The support plate 18a indicated by a broken line in FIG. 8 is inclined. In the inclined state as well, the support plate 18a can be smoothly supported by the first elevating member 14', which moves in the vertical direction, through the rotary support mechanism 18j.

Figure 9:
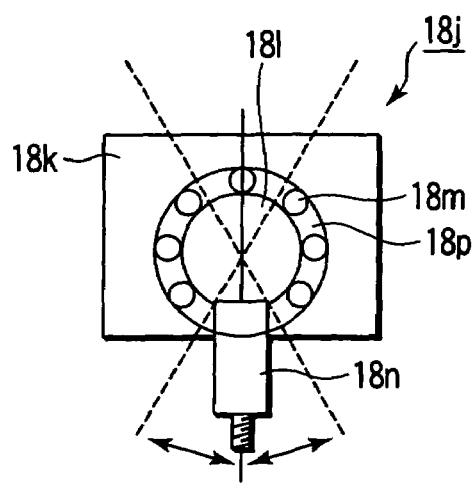
FIG. 9 is a sectional view showing an example of a ball joint mechanism.

FIG. 9 shows a ball joint 18j as an example of the rotary support mechanism 18j. The ball joint 18j can include a stationary portion 18k, spherical hole 18p in the stationary portion 18k, ball bearings 18m, support column 18n, and sphere 18l provided to the head of the support column 18n. The support column 18n may have a base part at its lower end.

The ball joint 18j can be fixed to the lower portion of the support plate 18a through the stationary portion 18k. In FIG. 8, even when the support plate 18a is inclined as indicated by the broken line, the sphere 18l can freely rotate in the spherical hole 18p through the ball bearings. The inclined support plate 18a can be smoothly supported by the support column 18n of the first elevating means 14 through rotation of the sphere 18l.

In FIG. 8, when the support heights of the plurality of the first elevating mechanisms 18 are adjusted, the inclined support plate 18a indicated by the broken line can be corrected to the horizontal position.

Figure 3:
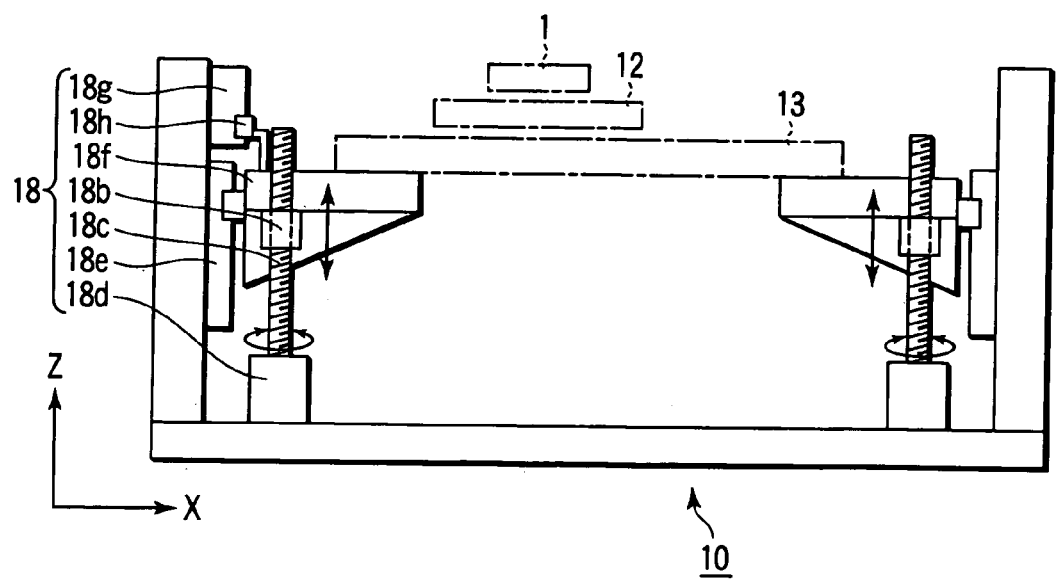
FIG. 3 is a sectional view showing a stage driving apparatus according to another embodiment of the present invention.

In place of the support plate 18a, a support plate 18f having an opening at its center may be used, as shown in FIG. 3. As shown in FIG. 3, a scale 18g arranged above either guide rail 18e, and a detector 18h for detecting the gradations of the scale 18g can also measure the elevating amount of the stage 1.

Figure 2:
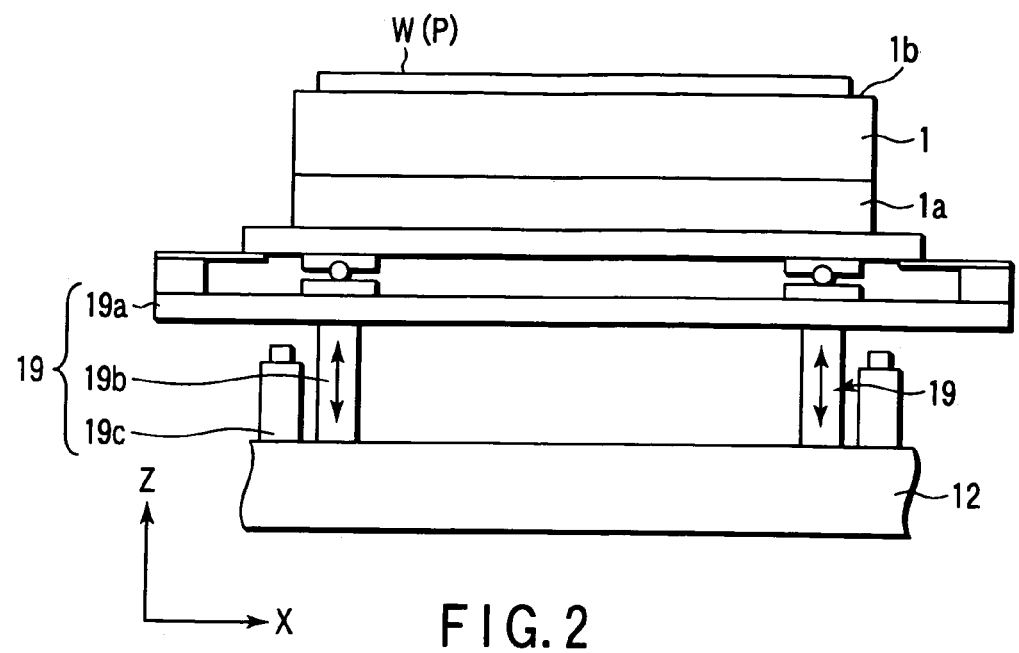
FIG. 2 is an enlarged sectional view of the second elevating mechanism of a stage driving apparatus for the stage shown in FIG. 1.

As shown in FIGS. 1 and 2, the second elevating mechanism 19 can have a plurality of (e.g., 3 or 4) linear-direction driving members (e.g., piezoelectric effect elements or piezo elements) 19b arranged equidistantly and having a piezoelectric effect. The linear-direction driving members 19b support the stage 1 through a support 19a. When the voltages to be applied to the piezoelectric elements 19b are controlled to adjust the expanding/contracting amounts of the piezoelectric elements 19b, the stage 1 can be vertically moved by the piezoelectric elements 19b over a short distance (for example, hundreds of microns, more precisely 200 to 500 µm) in directions indicated by arrows in FIG. 2. The X table 12 can be provided with elevation detectors 19c which detect the elevation distance of the stage 1. As an elevation detector 19c, a laser displacement sensor, electrostatic capacitance sensor, or the like can be employed. The elevation distance of the stage 1 can be controlled on the basis of the detection values of the elevation detectors 19c. As the linear-direction driving member 19b, a mechanism that uses a motor and ball screw can also be employed. The linear-direction driving member 19b using a piezoelectric element 19b can generate a driving force larger than that generated by the mechanism that uses the motor and ball screw. When the voltages to be applied to the piezoelectric elements 19b are controlled, the small expanding/contracting amounts of the piezoelectric elements can be controlled at high speed and with high accuracy. The individual piezoelectric elements 19b can be controlled. Thus, when a contact load nonuniformly acts on the peripheral portion of the stage 1, the stage 1 can be kept horizontal by controlling the individual piezoelectric elements 19b.

With the characteristics of the piezoelectric element 19b that the output per unit volume is large, a high rigidity can be realized. The second elevating mechanism 19 can be made lightweight. The stage 1 can be horizontally moved at high speed by the first horizontal driving mechanism 17.

The operation of the prober 10 of this embodiment will be described with reference to FIGS. 1 to 4B.

(a) The wafer W is placed on the stage 1 in the prober chamber 15 from a loader chamber 6.

(b) The stage 1 is moved in the X, Y and Z directions, and the prescribed one of the probes 16a of the probing card 16 are imaged by using the lower camera 5a of the alignment mechanism (5a, 5b). The position of the distal end of the prescribed probe 16a are thereby measured.

Similarly, the stage 1 is moved in the X, Y, Z and θ directions, and the position of the object P on the stage 1 is measured by using the upper camera 5b.

(c) In accordance with the position of the distal end of the probe 16a and the position of the object P on the stage 1, which have been measured in (b), the object P formed on the wafer W and the distal end of the probe 16a of the probing card 16 are aligned with each other.

During the alignment, the X and Y tables 12 and 13 of the first horizontal driving mechanism 17 move at high speed above the support plate 18a in the X and Y directions. The motors 18d of the first elevating mechanism 18 drive at high speed, to align the wafer W and the probes 16a of the probing card 16 with each other quickly.

(d) The stage is moved upward toward the probing card 16 with the first elevating mechanism 18. In the upward movement, the object P to be tested on the stage 1 does not come into contact with the plurality of probes 16a of the probing card 16.

(e) The stage 1 is over-driven toward the probe 16a by the second elevating mechanism 19 after the object P to be tested, which is mounted on the stage 1, is set into contact with the probe 16a.

(f) The electrical characteristics of the object P to be tested are tested by the tester 7.

(g) After the test, the stage 1 is moved downward by the second elevating mechanism 19, and the object P to be tested separates from the probes 16a.

(h) The stage 1 is indexing by the first horizontal driving mechanism 17. With the indexing, the next object P to be tested is moved to a position immediately below the probes 16a of the probing card 16.

During the indexing, the wafer W on the stage 1 is moved downward by a short distance by expansion and contraction of the piezoelectric elements 19b of the second elevating mechanism 19. Consequently, indexing can be performed such that the wafer W and probes 16a are separate from each other by a short distance.

(i) The above (e) to (h) are repeated to test the electrical characteristics of a predetermined object P to be tested on the substrate to be tested. More specifically, the second elevating mechanism 19 vertically moves the stage 1 to bring the wafer W into electrical contact with the probes 16a, so that the electrical characteristics of the wafer W are tested.

In a method of performing (a) to (i), above, preferably, the following (b') is performed subsequent to (b), above.

(b') On the basis of the two measurement results, whether or not the stage surface 1b of the stage 1 and a position of a distal end of a predetermined probe among the probes 16a of the probing card 16 are parallel is determined. If not parallel, the non-parallel degree is grasped.

The angle of inclination of the stage 1 is adjusted by the first elevating mechanism 18 such that the stage surface 1b of the stage 1 becomes parallel to the distal end position of the predetermined probe among the plurality of probes 16a of the probing card 16 arranged above the stage 1.

Figure 4A:
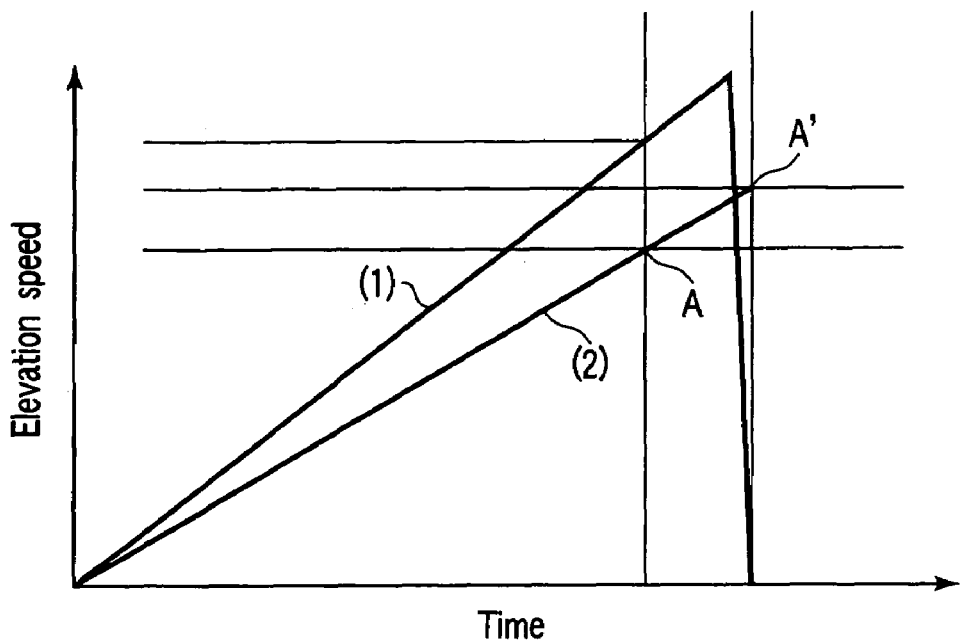
FIG. 4A is a graph showing the relationship between time and the elevation speed of the second elevating mechanism shown in FIG. 1 and the relationship between time and the contact state of a wafer and probes.
Figure 4B:
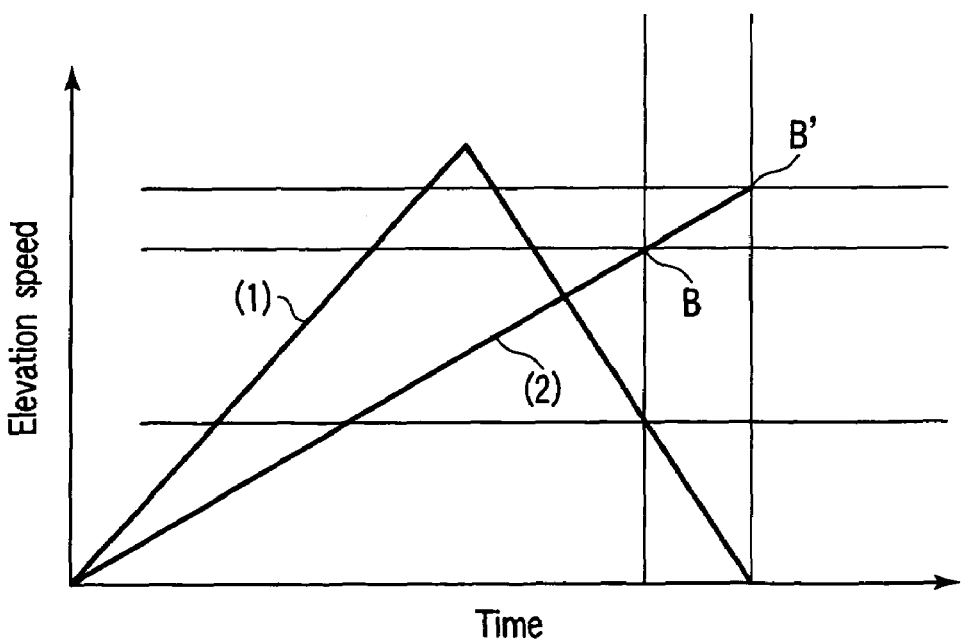
FIG. 4B is a graph showing the relationship between time and the elevation speed of a conventional elevating mechanism and the relationship between time and the contact state of a wafer and probes.

FIGS. 4A and 4B are graphs for comparing the elevation speed of the wafer W on the stage 1 when the piezoelectric elements 19b of the second elevating mechanism 19 are used and the elevation speed of the stage 1 when conventional ball screws are used. Referring to FIGS. 4A and 4B, (1) indicates the elevation speed of the stage 1; and (2), the upward moving distance of the stage 1 (wafer).

As shown in FIG. 4A, when piezoelectric elements 19b are used, the response is quick and the deceleration time can be made short. Hence, even after a time point (point A in FIG. 4A) at which the electrode pads of the wafer W and the probes 16a come into contact with each other for the first time, if the stage 1 is moved upward and over-driven, the probes 16a can be brought into contact with the electrode pads at high speed through oxide films on the surfaces of the electrode pads. After that (point A' in FIG. 4A), the piezoelectric elements 19b are decelerated quickly, to realize a high-speed probe test.

In contrast to this, in the conventional case, it takes time to decelerate the motors, and the response is slow, as shown in FIG. 4B. Hence, the peak of the elevation speed must be set to come before the time point (point B in FIG. 4B) at which the probes 16a come into contact with the electrode pads of the wafer W, and the electrode pads and the probes 16a must be brought into contact with each other during deceleration of the motors. Hence, to increase the speed of probe testing is difficult.

As described above, according to this embodiment, the stage driving apparatus 9 of the prober 10 has the stage 1 for placing the wafer W thereon, the first horizontal driving mechanism 17 for moving the stage 1 in the horizontal direction, and the elevating mechanism 14 for moving the stage 1 in the vertical direction. The elevating mechanism 14 can include the first elevating mechanism 18 and second elevating mechanism 19.

The first elevating mechanism 18 supports the first horizontal driving mechanism 17 and vertically moves it. The second elevating mechanism 19 is placed on the first horizontal driving mechanism 17, and supports the stage 1 and vertically moves it a short distance. Consequently, even if the probing card 16 varies and the contact load increases, the weight of the second elevating mechanism 19 for probing need not be increased. The first horizontal driving mechanism 17 can be driven at high speed. High-speed testing can be realized by drive-controlling the stage 1 at high speed.

According to this embodiment, the support plate 18a of the first elevating mechanism 18 can be supported at its four corners such that it can move vertically. Even when a nonuniform load from the probes 16a acts on the wafer W on the stage 1, the support plate 18a will not be inclined.

Regarding the stage 1 itself, if piezoelectric elements 19b having high rigidity are employed, the stage 1 can be supported at a plurality of (e.g., 3 or 4) portions. The stage 1 will not likely to be inclined by the nonuniform load from the probes 16a. Even if the stage 1 may be inclined, its inclination can be prevented by controlling the elevation amounts of the piezoelectric elements 19b individually.

When the expanding/contracting amounts of the piezoelectric elements 19b are controlled, the stage 1 can be driven at high speed over a short distance. Consequently, the test speed can be further increased, and the rigidity of the stage 1 itself can be increased.

Figure 5:
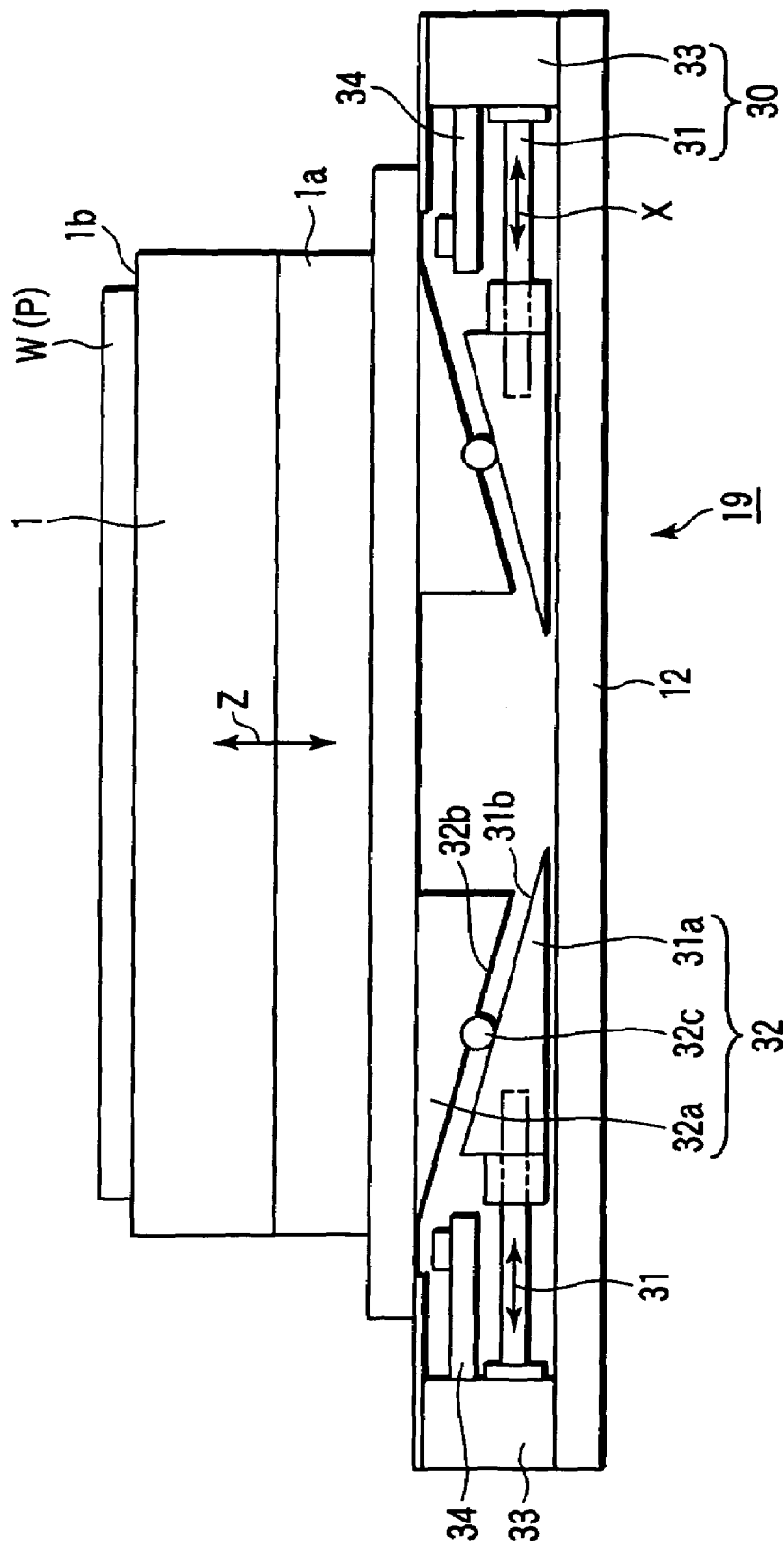
FIG. 5 is a sectional view schematically showing a stage driving apparatus according to another embodiment of the present invention.

FIG. 5 schematically shows a second elevating mechanism 19 according to another embodiment of the present invention. A stage driving apparatus 9 of this embodiment can be configured in the same manner as in the above embodiment except for the second elevating mechanism 19. For example, the second elevating mechanism 19 of this embodiment has, below the outer periphery of a stage 1, second horizontal driving mechanisms 30 (e.g., mechanisms having piezoelectric elements 31 exhibiting a piezoelectric effect) arranged horizontally at three locations equidistantly in the circumferential direction, and direction switching means 32 for converting expansion/contraction of the piezoelectric elements 31 into movement in the vertical direction. The stage 1 can be elevated a predetermined distance by controlling the expanding/contracting amounts of the respective piezoelectric elements 31.

The direction switching means 32 of this embodiment has a first wedge member 31a, under the lower surface of the stage 1, which can move forward and backward and has a first inclined surface 31b inclined downward from the outer side toward the inner side in the radial direction, and a second wedge member 32a arranged to oppose the first inclined surface 31b through a ball bearing 32c. The second wedge member 32a has a second inclined surface 32b.

Each first wedge member 31a is connected to one end of the corresponding piezoelectric element 31. The other end of the piezoelectric element 31 can be fixed to a corresponding stationary portion 33 arranged on an X table 12. The stationary portion 33 can be provided with elevation detectors 34 (e.g., laser displacement sensors or electrostatic capacitance sensors) which detect the elevation distance of the stage 1. The elevation distance of the stage 1 can be controlled on the basis of the detection values of the elevation detectors 34.

When the stage 1 is to be vertically moved a short distance, the piezoelectric elements 31 at three locations are expanded or contracted in directions indicated by arrows X in FIG. 5 under the control of a controller 11 on the basis of the detection values of the elevation detectors 34, to move the first wedge members 31a forward/backward in the radial direction. The stage 1 can be vertically moved as indicated by arrows Z in FIG. 5 through the first inclined surfaces 31b of the first wedge members 31a, the second inclined surfaces 32b, and ball bearings 32c. In this embodiment as well, a function and effect similar to those of the above embodiment can be expected.

Figure 6:
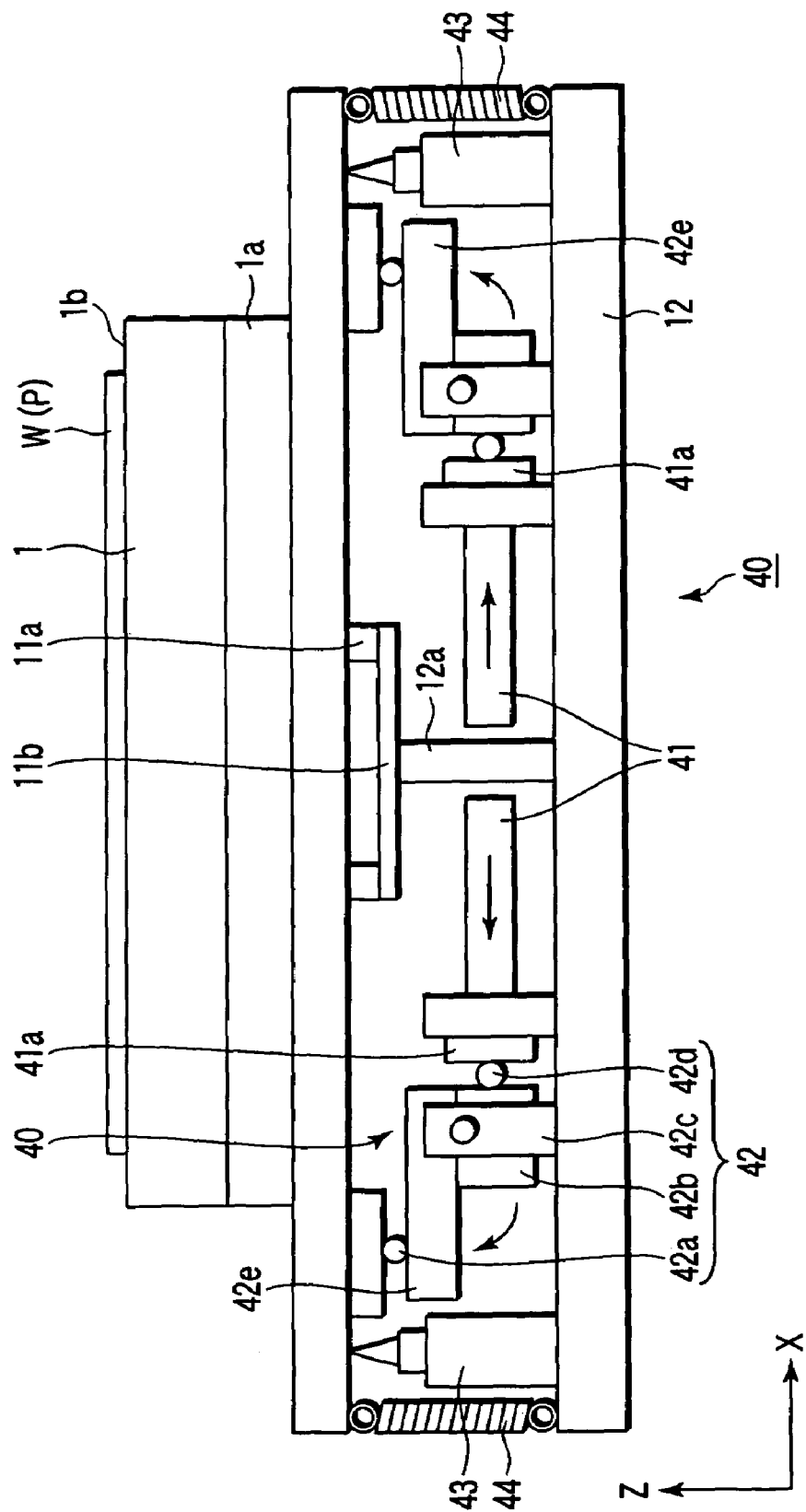
FIG. 6 is a sectional view schematically showing a stage driving apparatus according to still another embodiment of the present invention.

FIG. 6 is a view schematically showing a second elevating mechanism 40 according to still another embodiment of the present invention. The prober of this embodiment can be configured in the same manner as the respective embodiments described above except for the second elevating mechanism 40.

A second elevating mechanism 40 according to this embodiment can have piezoelectric elements 41 (e.g., at three locations) which are horizontally arranged radially from a central portion below a stage 1 and have a piezoelectric effect, and direction switching means 42 (e.g., at three locations) which convert the expanding/contracting forces of the piezoelectric elements 41 into movement in the vertical direction. When the expanding/contracting amounts of the respective piezoelectric elements 41 are controlled, the stage 1 can be vertically moved a predetermined distance. A leaf spring 11b can be arranged at the central portion of the lower surface of the stage 1 through spacers 11a. A support column 12a vertically extending from the center of an X table 12 is in contact with the leaf spring 11b.

The direction switching means 42 of this embodiment can have an L-shaped turning member 42b a distal end 42e of which comes into contact with the peripheral portion of the lower surface of the stage 1 through a ball bearing 42a, and a support member 42c which axially supports the turning member 42b such that the turning member 42b can turn. The other end of the L-shaped turning member 42b engages with an engaging portion 41a at one end of the corresponding piezoelectric element 41 through a ball bearing 42d. The turning member 42b can serve to convert expansion and contraction in the horizontal direction of the piezoelectric element 41 into movement in the vertical direction and amplify the expanding/contracting amount of the piezoelectric element 41. Consequently, the stage 1 can elevate by an elevating amount larger than the expanding/contracting amount of the piezoelectric element 41.

Elevation detectors 43 (e.g., laser displacement sensors or electrostatic capacitance sensors) which detect the elevation distance of the stage 1 can be arranged outside the turning members 42b. The elevation distance of the stage 1 can be controlled on the basis of the elevation distances of the respective portions detected by the elevation detectors 43. The expanding/contracting amounts of the piezoelectric elements 41 can be controlled on the basis of the detection values, to horizontally control the stage 1.

Springs 44 which connect the stage 1 and X table 12 such that the springs 44 can expand and contract can be arranged further outside the elevation detectors 43. The springs 44 can restore the stage 1, that has moved upward, to the initial state quickly.

According to this embodiment, the same function and effect as those of the embodiments described above can be expected. The stage 1 can be vertically moved by an amount larger than the expanding/contracting amount of the piezoelectric elements 41.

The present invention is not limited to the above embodiments at all. For example, the direction switching means may be arranged to correspond to the second horizontal driving mechanisms. Accordingly, the direction switching means need not always be arranged equidistantly in the circumferential direction of the stage 1, and the number of direction switching means is not limited to three.

In each embodiment, if piezoelectric elements having strain gauges are used, the elevation detectors can be omitted. The second inclined surfaces 32b at three locations may be formed in an integral member as passages for the wedge members. The object P to be tested is not limited to a wafer, but can be an LCD substrate or IC chip.

According to the embodiments of the present invention, there is provided a stage driving apparatus 9 and a probe method which, even when the contact load increases as the probing card 16 varies, can drive-control the stage 1 at high speed to realize high-speed testing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A stage driving apparatus formed to move a stage having a substrate to be tested on a stage surface thereof in horizontal and vertical directions, the stage driving apparatus comprising:
   a second elevating mechanism configured to support the stage and move the stage in the vertical direction;
   a first horizontal driving mechanism configured to support the second elevating mechanism and move the second elevating mechanism on a horizontal plane; and
   a first elevating mechanism configured to support the first horizontal driving mechanism and move the first horizontal driving mechanism in the vertical direction.

2. A stage driving apparatus according to claim 1, wherein the second elevating mechanism has a plurality of linear-direction driving members, the plurality of linear-direction driving members being configured to support the stage at a plurality of portions and move the stage in the vertical direction.

3. A stage driving apparatus according to claim 2, wherein the linear-direction driving members include one of a piezoelectric-effect member and a ball screw.

4. A stage driving apparatus according to claim 1, wherein the second elevating mechanism has at least one second horizontal driving mechanism which generates a driving force in the horizontal direction, and at least one direction switching unit which converts the horizontal-direction driving force of the second horizontal driving mechanism into a driving force in the vertical direction.

5. A stage driving apparatus according to claim 4, wherein the direction switching unit includes:
   a first wedge member arranged on the first horizontal driving mechanism to be movable, the first wedge member being moved forward/backward in the horizontal direction by the horizontal-direction driving force of the second horizontal driving mechanism; and
   a second wedge member fixed to a lower portion of the stage, and the first wedge member is arranged to oppose the second wedge member, and moved forward/backward in the horizontal direction by the horizontal-direction driving force of the second horizontal driving mechanism, to move the second wedge member, thus moving the stage in the vertical direction.

6. A stage driving apparatus according to claim 4, wherein the direction switching unit includes:
   a turning member which is turned by the horizontal-direction driving force of the second horizontal driving mechanism, a distal end of the turning member coming into contact with a lower portion of the stage, and the turning member turning to move the stage in the vertical direction; and
   a support member which supports the turning member to be turnable.

7. A stage driving apparatus according to claim 1, wherein the first elevating mechanism includes at least one first elevating means having a support which supports the first horizontal driving mechanism and can move in the vertical direction, a guide member which guides movement in the vertical direction of the support, and a ball screw and motor configured to vertically move the support along the guide member.

8. A stage driving apparatus according to claim 1, wherein the first elevating mechanism serves, in addition to moving the first horizontal driving mechanism in the vertical direction, to adjust an angle of inclination of the stage such that the stage surface of the stage becomes parallel to a position of a distal end of a predetermined probe among probes of a probing card arranged above the stage.

9. A stage driving apparatus according to claim 1, wherein the second elevating mechanism has a function of adjusting an angle of inclination of the stage such that the stage surface of the stage becomes parallel to the distal end of a prescribed one of the probes of the probing card that is arranged above the stage.

10. A stage driving apparatus according to claim 1, wherein the first elevating mechanism includes a plurality of first elevating members, each of the first elevating members being configured to support the first horizontal driving mechanism through a rotary support mechanism and move the first horizontal driving mechanism in the vertical direction.

11. In a prober comprising a tester and stage, a probe method of testing electrical characteristics of an object to be tested on a substrate to be tested, the probe method comprising:
   (a1) placing the substrate to be tested on a stage surface of the stage;
   (a2) detecting a position of the object to be tested formed on the substrate to be tested and a position of a predetermined probe among a plurality of probes of a probing card arranged above the stage;
   (a3) moving the stage in X, Y, Z and θ directions to align the object to be tested on the substrate to be tested on the stage and the probes of the probing card arranged on the stage;
   (a4) moving the stage upward by a first elevating mechanism toward the probing card, such upward moving not bringing the object to be tested on the stage into contact with the plurality of probes of the probing card;
   (a5) over-driving the stage toward the probes by a second elevating mechanism after the object to be tested, which is mounted on the stage, is set into contact with the probe;

(a6) testing the electrical characteristics of the object to be tested with a tester;

(a7) after testing, moving the stage downward by the second elevating mechanism to separate the object to be tested from the probes;

(a8) indexing the stage by a horizontal driving mechanism, such indexing serving to move the next object to be tested to a position immediately below the probes of the probing card; and (a9) repeating to test the electrical characteristics of a predetermined object to be tested on the substrate to be tested.

12. A probe method according to claim 11 comprising, after position detection of (a2), performing the following (a2'):

(a2') adjusting an angle of inclination of the stage by the first elevating mechanism such that the stage surface of the stage becomes parallel to a position of a distal end of a predetermined probe among the probes of the probing card arranged above the stage.

13. A probe method according to claim 11, further comprising, after position detection of (a2), performing the following (a2"):

(a2") adjusting an angle of inclination of the stage by the second elevating mechanism such that the stage surface of the stage becomes parallel to the distal end of a prescribed one of the probes of the probing card that is arranged above the stage.

* * * * *